United States Patent
Althouse et al.

[11] Patent Number: 5,908,114
[45] Date of Patent: *Jun. 1, 1999

[54] TAPE CARRIER FOR ELECTRONIC AND ELECTRICAL PARTS

[75] Inventors: Victor E. Althouse, Los Altos; Christopher E. Brodie, Mountain View, both of Calif.

[73] Assignee: GelPak, LLC, Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/926,345

[22] Filed: Sep. 9, 1997

[51] Int. Cl.⁶ .................................................. B65D 85/30
[52] U.S. Cl. ........................................... 206/714; 206/716
[58] Field of Search ................... 206/460, 712, 206/713, 714, 716, 725; 174/52.4

[56] References Cited

U.S. PATENT DOCUMENTS

| | | | |
|---|---|---|---|
| 2,885,849 | 5/1959 | Wohlman, Jr. | 53/198 |
| 3,177,629 | 4/1965 | Anspach | 53/198 |
| 3,608,711 | 9/1971 | Wiesler et al. | 206/56 A |
| 3,971,193 | 7/1976 | Tardiff et al. | 53/198 R |
| 4,298,120 | 11/1981 | Kaneko et al. | 206/329 |
| 4,406,367 | 9/1983 | Bouwknegt | 206/329 |
| 4,575,995 | 3/1986 | Tabuchi et al. | 53/591 |
| 4,667,944 | 5/1987 | Althouse | 269/21 |
| 4,711,014 | 12/1987 | Althouse | 29/412 |
| 4,724,954 | 2/1988 | Sillner | 198/841 |
| 4,778,326 | 10/1988 | Althouse et al. | 414/786 |
| 4,954,207 | 9/1990 | Higuchi et al. | 156/552 |
| 4,966,281 | 10/1990 | Kawanishi et al. | 206/330 |
| 4,966,282 | 10/1990 | Kawanishi et al. | 206/330 |
| 5,022,424 | 6/1991 | Reynolds et al. . | |
| 5,025,923 | 6/1991 | Okui | 206/329 |
| 5,343,363 | 8/1994 | Greeson et al. | 361/749 |
| 5,524,765 | 6/1996 | Gutentag | 206/713 |
| 5,667,073 | 9/1997 | Okui | 206/714 |
| 5,682,731 | 11/1997 | Althouse | 53/47 |
| 5,727,688 | 3/1998 | Ishii et al. | 206/714 |
| 5,729,963 | 3/1998 | Bird . | |
| 5,769,237 | 6/1998 | Althouse et al. | 206/714 |

FOREIGN PATENT DOCUMENTS

| | | | |
|---|---|---|---|
| 4-45368 | 2/1990 | Japan | 206/330 |
| 4-128152 | 4/1992 | Japan | 206/330 |

*Primary Examiner*—David T. Fidel
*Attorney, Agent, or Firm*—Wilson Sonsini Goodrich & Rosati

[57] ABSTRACT

A carrier tape for electronic or electrical devices which contains a support film containing pockets. The floor of each pocket has been weakened, for example, by means of slits, so that it can be easily deformed. A device is releasably attached to a fastening member in the pocket, for example to a layer of a PSA or an elastomer on the floor of the pocket. When a deforming force is applied to the floor of the pocket, the floor deforms and separates the device from the fastening member, making it easy to remove from the pocket.

22 Claims, 1 Drawing Sheet

TAPE CARRIER FOR ELECTRONIC AND ELECTRICAL PARTS

BACKGROUND OF THE INVENTION

1. Field of the Invention

This invention relates to tape carriers for electronic and electrical devices, including semiconductor chips.

2. Introduction to the Invention

When electronic and electrical devices are to be supplied to a desired location, it is conventional to make use of a tape carrier comprising spaced-apart pockets, with one device in each pocket. Such pocketed tapes are sometimes referred to as "embossed" tapes. The tape carrier often has sprocket holes on one or both edge portions so that it can be handled in a controlled manner. Ordinarily, the pockets are formed in the tape, and a cover tape, and/or a mechanical retaining member in the pocket, and/or a pressure sensitive adhesive (PSA) at the bottom of the pocket, are used to retain the electronic device in the pocket until it is removed, e.g. by means of a vacuum tool. In some cases, the pocket has a hole in the bottom so that an ejector pin can be pushed through the hole to eject the device. These known carrier tapes have one or more of a number of disadvantages. For example, different carriers are usually needed for different devices, since the pockets and the mechanical retaining members must be customized to particular devices, to ensure that the device does not fall out of the pocket and remains in a desired location and orientation in the pocket. Use of PSAs can suffer from the disadvantage that some of the adhesive may stick to the device, after it has been removed from the carrier; another disadvantage is that the level of adhesion can change with time and/or ambient conditions, with removal of the device generally becoming more difficult with time. Use of an ejector pin can damage the device if the contact force is excessive. In a variation of the "pocketed tape", apertures are punched in a tape and the apertures are converted into pockets by means of a strip of a PSA tape longitudinally bonded to the bottom of the punched tape or two strips of PSA tape with a small gap between them through which an ejector pin can be pushed. Tapes of this kind suffer from the disadvantage that the PSA tape does not afford good mechanical protection to the device, and the other disadvantages of the PSAs referred to above.

Copending, commonly assigned U.S. patent application Ser. No. 08/680,390, filed Jul. 15, 1996, by Victor Althouse and Christopher Brodie, discloses an improved pocketed tape carrier which includes, in each of the pockets, a fastening member comprising a flexible polymeric film which is selectively secured to the floor of the pocket so that the fastening member comprises (a) a fixed portion which is attached to the floor of the pocket, and (b) a release portion which is composed of a flexible polymeric film and which can be deformed away from the floor without detaching the fixed portion from the floor.

Copending, commonly assigned U.S. patent application Ser. No. 08/616,675 now Pat. No. 5,682,731 filed Mar. 15, 1996, by Victor Althouse, describes a pocket-free carrier tape for electronic and electrical devices which comprises a carrier member which comprises a pocketless support film and a fastening layer on the support film, and a deformable cover film which is separably attached to the fastening layer.

SUMMARY OF THE INVENTION

We have discovered, in accordance with the present invention, that improved results can be obtained through the use of a pocketed tape in which the floor of each pocket has been weakened so that the floor can be more easily deformed upwards into the pocket, thus making it easier to remove the device from the pocket.

In a first preferred aspect, this invention provides a tape carrier for electronic and electrical devices, the carrier comprising (1) a flexible support film which
  (a) is composed of a polymeric material, and
  (b) comprises
    (i) two longitudinally extending edge portions, and
    (ii) a longitudinally extending central portion which lies between the edge portions and which comprises a plurality of spaced-apart pockets, each of the pockets having a floor which has been weakened so that its resistance to deformation into the pocket is substantially reduced; and (2) within each of the pockets, and covering at least part of the central portion thereof, a fastening layer of a material to which the electronic or electrical device will releasably adhere.

In a second preferred aspect, this invention provides an assembly of electronic or electrical devices, the assembly comprising (1) a flexible support film which
  (a) is composed of a polymeric material, and
  (b) comprises
    (i) two longitudinally extending edge portions, and
    (ii) a longitudinally extending central portion which lies between the edge portions and which comprises a plurality of spaced-apart pockets, each of the pockets having a floor which has been weakened so that its resistance to deformation into the pocket is substantially reduced; and (2) within each of the pockets, a fastening member having one of said devices releasably attached thereto.

In a third preferred aspect, this invention provides a method of making a tape carrier according to the first aspect of the invention, the method comprising (1) providing a tape member which comprises a flexible support film which
  (a) is composed of a polymeric material, and
  (b) comprises
    (i) two longitudinally extending edge portions, and
    (ii) a longitudinally extending central portion which lies between the edge portions and which comprises a plurality of spaced-apart pockets, each of the pockets having a floor;

(2) subjecting the floor of each pocket to a treatment which reduces the resistance of the floor to deformation into the pocket; and (3) placing a fastening layer of a polymeric material on the floor of each pocket.

In a fourth preferred aspect, this invention provides a method of processing electronic or electrical devices which comprises (A) providing an assembly of electronic or electrical devices according to the second aspect of the invention;

(B) advancing said assembly through a work station;

(C) sequentially subjecting the central portion of the floor of each pocket to a treatment which deforms a central portion of the pocket, thus weakening the attachment between the fastening member and the device; and (D) sequentially removing each device from each pocket while the central portion of the floor of the pocket is deformed.

BRIEF DESCRIPTION OF THE DRAWING

The invention is illustrated in the accompanying diagrammatic drawing, in which.

DETAILED DESCRIPTION OF THE INVENTION

Figure 1:
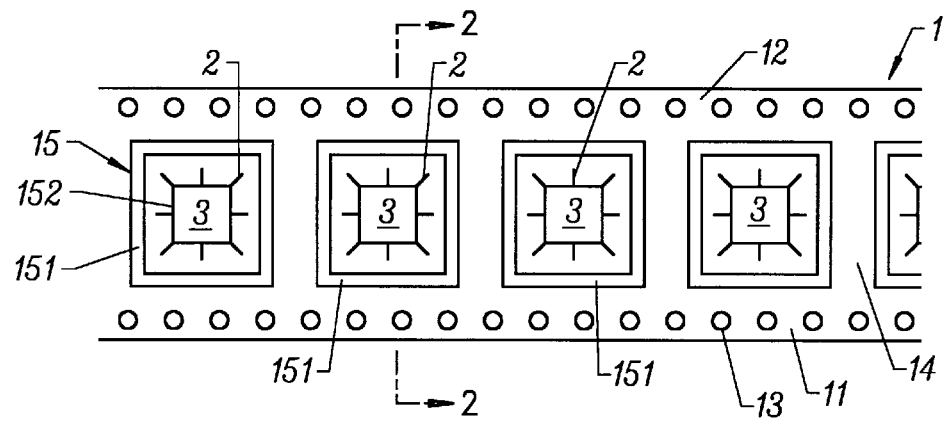
FIG. 1 is a plan view of an assembly of the invention.

In the description below, reference will be made to a number of specific features of the apparatus and methods of the invention. It is to be understood that these features, even if described in a particular context, e.g. as part of one of the Figures, can be used in any part of the invention, either individually or in any appropriate combination.

The support film must be one in which pockets can be formed, preferably by a conventional thermoforming or pressure forming process. Subject to this requirement, a wide variety of polymeric films can be used as the support film. The film can have one or more layers of the same or different polymers. One or more of the layers can contain a conductive filler, e.g. carbon black, so that it is electrically conductive and provide electrostatic discharge (ESD) protection. Suitable polymers include polystyrenes and polycarbonates, as well as polyesters, polyamides, polyimides, polyolefins, polyketones, polyetherimides, fluoropolymers, and polyvinyl chloride. The invention includes the possibility that the floor of the pocket is weakened at the same time as the pocket itself is formed. The thickness of the support film, where it has not been stretched by the pocket forming process, is generally 0.001 to 0.020 inch, preferably 0.001 to 0.016 inch. The support film will generally have sprocket holes along one or both edge portions thereof However, the invention includes the possibility that the assembly is handled without the need for sprocket holes.

The floor of each pocket is preferably weakened by forming slits through the thickness of the floor. The slits can be straight or curved and can be formed by cutting (including laser-cutting) or punching or in some other way. The slits can be formed without removing any material from the floor, or can be formed so as to leave one or more apertures in the floor. Preferably the slots are such that a central portion of the floor can be deformed upwards (i.e. into the pocket) without stretching or rupturing the material of the floor, for example slits which extend outwards from a central point.

The pocket contains a fastening member, preferably a fastening layer of a suitable polymeric material. The fastening layer covers at least the central portion of the floor and can cover substantially the whole of the floor. The fastening layer can be composed of a PSA or of an elastomer of the kind disclosed in copending, commonly assigned U.S. application Ser. No. 08/616,675, now Pat. No. 5,682,731, filed Mar. 15, 1996, the disclosure of which is incorporated herein by reference. When an elastomer is used, it preferably has a hardness which is from 20 on the Shore 00 scale to 70 on the Shore A scale, particularly 50 on the Shore 00 scale to 60 on the Shore A scale, especially 15 to 50, e.g. 20 to 50, on the Shore A scale. Suitable elastomers include polysiloxanes, polyurethanes, various thermoplastic elastomers (urethanes, styrenes, olefinics, copolyesters, alloys and polyamides) and other melt-processable or solvent-processable rubbers. The thickness of the fastening layer is generally 0.0005 to 0.025 inch, preferably 0.001 to 0.015 inch, particularly 0.001 to 0.006 inch. When the fastening layer is composed of an elastomer having a hardness of 15 to 50, e.g. 20 to 50, on the Shore A scale, the fastening layer preferably has a thickness of 0.001 to 0.010 inch, particularly 0.002 to 0.006 inch. The fastening member should of course be such that it will not defeat the purpose of weakening the floor. For example, in the preferred embodiment, in which the fastening member is a layer of a polymeric composition, the slits in the floor should also pass through the layer, or the layer should be such that it will rupture or stretch easily when the floor of the pocket is deformed upwardly.

The Devices

The invention is particularly useful for handling small electronic devices, particularly flat devices such as semiconductor chips, both bare and packaged; other suitable devices include flip chips, ball grid arrays (BGAs) and some chip scale packages (CSPs) which use solder bumped technology. Fine pitch lead devices and other nonplanar devices can also be handled, if the pockets in the carrier tape are suitably formed. Other electrical and non-electrical components can also be used. The thickness of the device is preferably less than 0.25 inch. The area of the device is preferably less than 3 $inch^2$. The size of the pocket can be substantially larger than the device, e.g. up to 4 $inch^2$, for example 0.5 to 2.25 $inch^2$, preferably 0.8 to 1.2 $inch^2$, making it possible to use the same tape carrier for a wide variety of different devices.

Cover Films

If desired in order to provide environmental protection, the carrier tape having the devices in the pockets thereof can be covered by a cover film which is lightly secured to the support film between and around the pockets. The cover film is of course removed before the devices are taken out of the pockets. A wide variety of polymeric films can be used as the cover film. Suitable polymers include polyethylene and the other polymers specified above for the support film, and in addition polyvinyl acetate and cellulosic polymers. The thickness of the cover film is generally 0.0005 to 0.020 inch, preferably 0.001 to 0.003 inch.

When the floor of the pocket is deformed upwards, this peels the fastening layer away from the device, so that the device can be easily removed from the pocket. Preferably, the deformation is caused at least in part by an ejector pin which is pushed upwards against the outside of the floor of the pocket. Because the ejector pin need not, and preferably does not, pass through an aperture in the pocket, it can be, and preferably is, relatively blunt; this reduces the danger of damaging the device. In addition the fastening layer cushions the device from the ejector pin and further reduces the danger of damaging the device.

Figure 2:
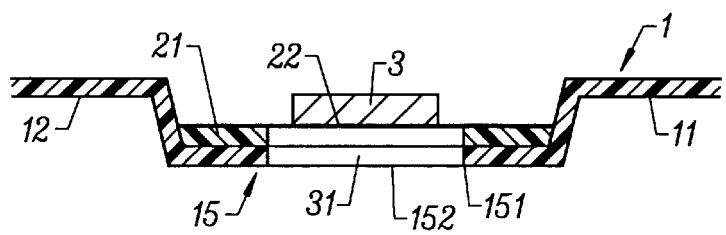
FIG. 2 is an enlarged cross-section on line II—II through the assembly of FIG. 1, the thicknesses of the components being exaggerated for clarity.
Figure 3:
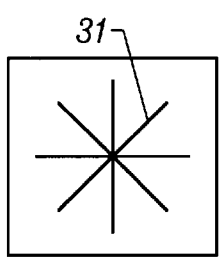
FIG. 3 is an enlarged view of the floor of the pocket shown in FIGS. 1 and 2.
Figure 7:
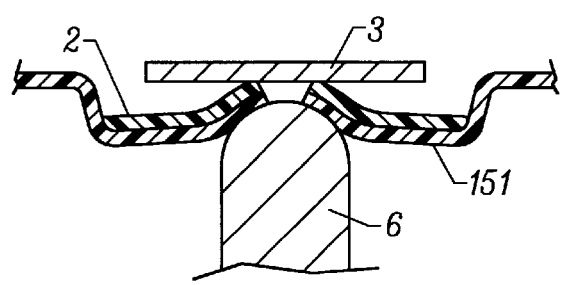
FIG. 7 shows the use of an ejector pin to remove a device from the assembly of FIGS. 1–3.

Referring now to the drawing, FIGS. 1, 2 and 3 show an assembly of the invention comprising a flexible support film 1 which comprises two longitudinally extending edge portions 11, 12 having sprocket holes 13 therein and a longitudinally extending central portion 14. In the central portion 14 there are spaced-apart pockets 15. On the floor of each pocket there is a fastening layer 2 of a PSA or a soft elastomer. Each pocket has a floor 151 which has been weakened by slits 31, as best shown in FIG. 3, which is a plan view of the floor of the pocket. A device 3 lies on the upper side of the fastening layer 2. The fastening layer has sufficient adhesive character to hold the device firmly in place during normal handling and storage of the carrier tape. However, as shown in FIG. 7, when an ejector pin 6 is pushed upwards against the floor of the pocket, the floor and the layer 2 deform, thus reducing the contact area between the device 3 and the fastening layer 2 (not shown), so that the device can be easily removed from the pocket, e.g. with a vacuum tool.

Figure 4:
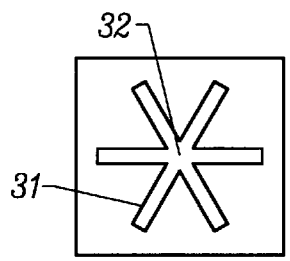
FIGS. 4–6 show representative patterns for the slits in a pocket.
Figure 5:
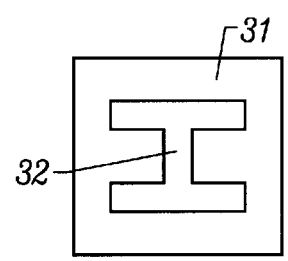
Figure 6:
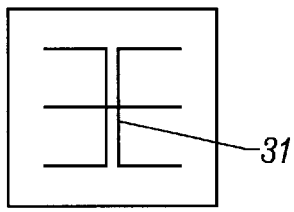

FIGS. 4–6 show alternative patterns for the slits which pass through the floor and preferably also through the fastening layer. In FIGS. 4 and 5, there is an aperture 32 in the floor.

We claim:

1. A tape carrier for electronic and electrical devices, the carrier comprising:
    a flexible support film composed of a polymeric material which has been shaped to form a plurality of longitudinally spaced-apart pockets, each pocket including a floor where the polymeric material forming the floor has been structurally weakened so that at least a central portion of the floor can be deformed without rupturing the polymeric material of the floor; and
    one or more fastening members positioned on the floor of each pocket to which an electronic or electrical device can be releasably attached.

2. A tape carrier according to claim 1 wherein the polymeric material forming the floor includes one or more slits through a thickness of the polymeric material forming the floor which structurally weaken the floor.

3. A tape carrier according to claim 2 wherein the one or more slits allow at least a central portion of the floor to be deformed without stretching or rupturing the polymeric material.

4. A tape carrier according to claim 2 wherein the one or more slits pass through a central point in the floor.

5. A tape carrier according to claim 2 wherein the polymeric material forming the floor includes an aperture in the polymeric material forming the floor which structurally weakens the floor.

6. A tape carrier according to claim 2 wherein the fastening member is a layer of a pressure-sensitive adhesive on the floor of the pocket.

7. A tape carrier according to claim 1 wherein the fastening member is a layer on the floor of the pocket which is 0.001 to 0.010 inch thick and is composed of an elastomer having a hardness between 15 on the Shore A scale and 50 on the Shore A scale.

8. A tape carrier for electronic and electrical devices, the carrier comprising:
    a flexible support film composed of a polymeric material which has been shaped to form a plurality of longitudinally spaced-apart pockets, each pocket including a floor having a plurality of slits which pass through a thickness of the floor which weaken the floor so that at least a central portion of the floor can be deformed without stretching or rupturing the polymeric material of the floor; and
    a fastening layer of a polymeric material positioned on the floor of each pocket to which an electronic or electrical device releasably adheres.

9. An assembly of electronic and electrical devices, the assembly comprising:
    a tape carrier including
        a flexible support film composed of a polymeric material which has been shaped to form a plurality of longitudinally spaced-apart pockets, each pocket including a floor where the polymeric material forming the floor has been structurally weakened so that at least a central portion of the floor can be deformed without rupturing the polymeric material of the floor, and
        one or more fastening members positioned on the floor of each pocket to which an electronic or electrical device can be releasably attached; and
    at least one electronic and electrical device releasably attached within a pocket.

10. An assembly according to claim 9 wherein the polymeric material forming the floor includes one or more slits through a thickness of the polymeric material forming the floor which structurally weaken the floor.

11. An assembly according to claim 10 wherein the one or more slits allow at least a central portion of the floor to be deformed without stretching or rupturing the polymeric material.

12. An assembly according to claim 10 wherein the one or more slits pass through a central point in the floor.

13. An assembly according to claim 9 wherein the polymeric material forming the floor includes an aperture which structurally weakens the floor.

14. An assembly according to claim 9 wherein the fastening member is a layer of a pressure-sensitive adhesive on the floor of the pocket.

15. An assembly according to claim 9 wherein the fastening member is a layer on the floor of the pocket which is 0.001 to 0.010 inch thick and is composed of an elastomer having a hardness between 15 on the Shore A scale and 50 on the Shore A scale.

16. A method for making a tape carrier for electronic and electrical devices comprising:
    taking a flexible support film composed of a polymeric material;
    forming a plurality of longitudinally spaced-apart pockets in the flexible support film, each pocket including a floor;
    structurally weakening the polymeric material forming the floor so that at least a central portion of the floor can be deformed without rupturing the polymeric material of the floor; and
    placing one or more fastening members on the floor of each pocket to which an electronic or electrical device can be releasably attached.

17. A method according to claim 16 wherein the stop of structurally weakening the polymeric material forming the floor includes forming one or more slits through a thickness of the polymeric material forming the floor.

18. A method according to claim 16 wherein the step of structurally weakening the polymeric material forming the floor includes forming one or more slits which pass through a central point in the floor, the slits extending through the thickness of the polymeric material forming the floor.

19. A method according to claim 16 wherein the slits are positioned such that at least a central portion of the floor can be deformed without stretching the polymeric material of the floor.

20. A method of processing electronic or electrical devices comprising:
    taking an assembly of electronic and electrical devices, the assembly comprising a tape carrier including a flexible support film composed of a polymeric material which has been shaped to form a plurality of longitudinally spaced-apart pockets, each pocket including a floor where the polymeric material forming the floor has been structurally weakened so that at least a central portion of the floor can be deformed without rupturing the polymeric material of the floor, and one or more fastening members positioned on the floor of each pocket to which an electronic or electrical device can be releasably attached, and a plurality of electronic and electrical devices releasably attached within the plurality of longitudinally spaced-apart pockets;

advancing the assembly through a work station;

deforming the floors of the plurality of longitudinally spaced-apart pockets; and removing the plurality of electronic and electrical devices from the plurality of longitudinally spaced-apart pockets.

21. A method according to claim 20 wherein the step of deforming a floor of a pocket includes pushing an ejector against an outside portion of the assembly forming the floor.

22. A method according to claim 21 wherein the floor of the pocket has an aperture therein and pushing an ejector against an outside portion of the assembly forming the floor does not include pushing the ejector through the aperture.

* * * * *